(12) United States Patent
Jiang et al.

(10) Patent No.: US 7,091,065 B2
(45) Date of Patent: Aug. 15, 2006

(54) METHOD OF MAKING A CENTER BOND FLIP CHIP SEMICONDUCTOR CARRIER

(75) Inventors: Tongbi Jiang, Boise, ID (US); Alan G. Wood, Boise, ID (US)

(73) Assignee: Micron Technology, Inc., Boise, ID (US)

(*) Notice: Subject to any disclaimer, the term of this patent is extended or adjusted under 35 U.S.C. 154(b) by 197 days.

(21) Appl. No.: 10/667,391

(22) Filed: Sep. 23, 2003

(65) Prior Publication Data

US 2004/0057222 A1    Mar. 25, 2004

Related U.S. Application Data

(62) Division of application No. 09/680,473, filed on Oct. 6, 2000, now Pat. No. 6,647,620, which is a division of application No. 09/469,630, filed on Dec. 22, 1999, now Pat. No. 6,413,102.

(51) Int. Cl.
*H01L 21/50*     (2006.01)

(52) U.S. Cl. .................................................. 438/125
(58) Field of Classification Search ................ 438/106, 438/108, 117, 125
See application file for complete search history.

(56) References Cited

U.S. PATENT DOCUMENTS

| | | |
|---|---|---|
| 5,400,220 A | 3/1995 | Swamy |
| 5,818,697 A | 10/1998 | Armezzani et al. |
| 6,056,557 A | 5/2000 | Crotzer et al. |
| 6,140,707 A | 10/2000 | Plepys et al. |

*Primary Examiner*—Scott B. Geyer
(74) *Attorney, Agent, or Firm*—Dickstein Shapiro Morin & Oshinsky LLP

(57) ABSTRACT

A center bond flip chip device carrier and a method for making and using it are described. The carrier includes a flexible substrate supporting a plurality of conductive traces. A cut out portion is formed in each trace at a position within a gap of a layer of elastomeric material provided over the traces. Each cut out portion is sized and configured to receive a solder ball for electrically connecting the carrier with a semiconductor die.

24 Claims, 8 Drawing Sheets

METHOD OF MAKING A CENTER BOND FLIP CHIP SEMICONDUCTOR CARRIER

This application is a divisional of application Ser. No. 09/680,473, filed on Oct. 6, 2000, now U.S. Pat. No. 6,647,620 which is a divisional of application Ser. No. 09/469,630, filed on Dec. 22, 1999, now U.S. Pat. No. 6,413,102, which are hereby incorporated by reference in their entirety.

FIELD OF THE INVENTION

The present invention generally relates to semiconductor chip fabrication. More particularly, the present invention relates to a center bond flip chip semiconductor carrier and a method for making and using it to produce a semiconductor device.

BACKGROUND OF THE INVENTION

Semiconductor device packaging techniques are well known. In some conventional packaged devices, a die is attached to a carrier, and contacts of each are electrically connected. In one such packaged device called a flip-chip device, a semiconductor chip is flipped and bonded with a carrier such that contacts of the die face and bond to contacts of the carrier.

With reference to FIGS. 1–3, a conventional center bond flip chip device 10 is shown as including a flipped die 30 and a carrier 11. The carrier 11 has a flexible substrate 12 and an elastomeric cover material 14. The elastomeric material 14 may be formed of a silicone or a silicone-modified epoxy. The elastomeric material 14 includes a first portion 15 and a second portion 17 of generally equal size. The flexible substrate 12 is formed of a material exhibiting high temperature stability as well as high mechanical rigidity. The substrate 12 may be a flexible tape, such as, for example, a polyimide tape. Two commercially available polyimide tapes, KAPTON® from E.I. DuPont Nemours and Company and UPILEX® from Ube Industries, Ltd., can be used to form the substrate 12.

Conductive traces $16_a$, $16_b$, $16_c$ are formed on the flexible substrate 12 and positioned below the elastomeric material 14. The traces $16_a$, $16_b$, $16_c$ may be deposited on the flexible substrate 12 in a variety of ways, the most preferred method being electrolytic deposition. Other suitable methods include sputter coating and laminating a sheet of conductive material and etching away excess material to form the traces.

A gap 20 separates the two portions 15, 17 of the elastomeric material 14. Conductive lands $18_a$, $18_b$, $18_c$ are positioned on, respectively, the conductive traces $16_a$, $16_b$, 16 within the gap 20. The die 30 has been removed from the FIG. 1 for clarity of illustration of the lands $18_a$, $18_b$, $18_c$. As illustrated, the gap 20 is rectangularly shaped, although any configured gap will suffice as long as the conductive pads $18_a$, $18_b$, $18_c$ are not covered by the elastomeric material 14.

A die 30 is positioned on the elastomeric material 14 of the carrier 11. The carrier 11 is electrically connected with the die 30 by way of suitable conductive connecting structures, such as, for example, inner lead solder balls or bumps $19_a$, $19_b$, $19_c$ positioned on, respectively, the conductive pads or lands $18_a$, $18_b$, $18_c$. Conductive vias $22_a$, $22_b$, $22_c$ respectively extend from each of the underside surfaces of the traces $16_a$, $16_b$, $16_c$. Outer lead solder balls or bumps $24_a$, $24_b$, $24_c$, or other conductive connecting structures, are located in electrical connection with each respective via $22_a$, $22_b$, $22_c$ and serve to connect the traces $16_a$, $16_b$, $16_c$ to a structure or common base for mounting components, such as, for example, a printed circuit board 35. Preferably, the outer lead balls $24_a$, $24_b$, $24_c$ are about 16 mils in diameter.

Conventional center bond flip chip semiconductor devices have several disadvantages, particularly as die 30 sizes decrease and the contacts thereof are positioned closer together. One disadvantage is that adjacent traces $16_a$, $16_b$, $16_c$ of the carrier 11 and their associated conductive lands $18_a$, $18_b$, $18_c$ must likewise be positioned closer together to such an extent that the inner lead balls $19_a$, $19_b$, $19_c$ will occasionally contact one another, thereby shorting out the semiconductor device. Another disadvantage is that in positioning the inner lead balls $19_a$, $19_b$, $19_c$ on the conductive lands $18_a$, $18_b$, $18_c$, wicking of the solder balls onto the conductive traces may sometimes occur during the solder process, providing less of a solder ball surface to make good electrical contact between the die 30 bond pad and a conductive land 18 of the carrier 11.

There is, therefore, a need for a center bond flip chip semiconductor device design which alleviates to some extent these disadvantages.

SUMMARY OF THE INVENTION

The present invention provides a carrier for a semiconductor device which includes a substrate, at least one conductive trace located on the substrate, the trace including a recessed seat sized and configured to receive a conductive connecting structure, for example, a solder ball, and an elastomeric covering material, the material including a gap in which the conductive connecting structure may be located in the recessed seat to provide a reliable electrical connection of the trace with a flipped semiconductor die.

The present invention further provides a semiconductor device including a semiconductor die electrically connected to a carrier. The carrier includes at least one conductive trace located on a substrate. The trace includes a recessed seat sized and configured to receive a conductive connecting structure to allow electrical connection of the trace with the semiconductor die.

The present invention further provides an electronic system which includes a semiconductor die, a carrier and a structure for mounting the carrier. The carrier has a substrate, a plurality of conductive traces located on the substrate, and an elastomeric covering material. Each trace includes a recessed seat having a cut out portion sized and configured to receive a conductive connecting structure. The elastomeric material includes a gap corresponding to the location of the recessed seats to allow electrical connection of the traces with the semiconductor die.

The present invention further provides a method for making a carrier for a semiconductor die. The method includes locating at least one conductive trace on a substrate, and creating a recessed seated portion on the trace, which recessed seated portion can be used to seat a conductive connecting structure used for interconnecting the carrier to a semiconductor die.

The present invention further provides a method of making a semiconductor device. The method includes forming a carrier and electrically connecting the carrier with a semiconductor die. The forming includes locating at least one conductive trace on a substrate, creating a recessed seated portion on the trace, and affixing a conductive connecting structure which is coupled to the semiconductor die to the recessed seated portion.

The foregoing and other advantages and features of the invention will be more readily understood from the following detailed description of the invention, which is provided in connection with the accompanying drawings.

DETAILED DESCRIPTION OF THE PREFERRED EMBODIMENTS

Figure 4:
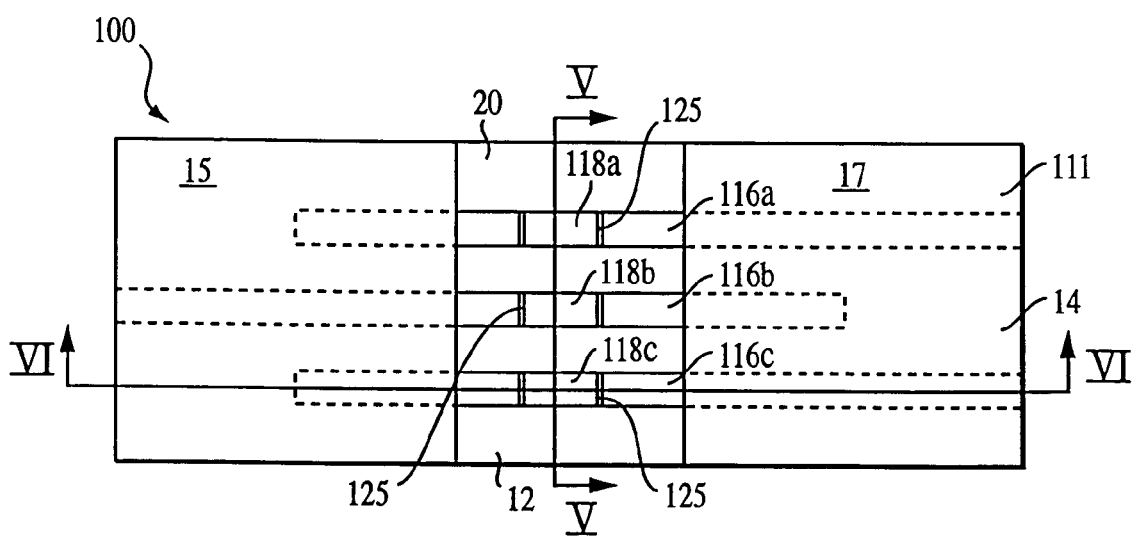
FIG. 4 is a top view of a carrier for a center bond flip chip semiconductor device constructed in accordance with an embodiment of the invention.
Figure 5:
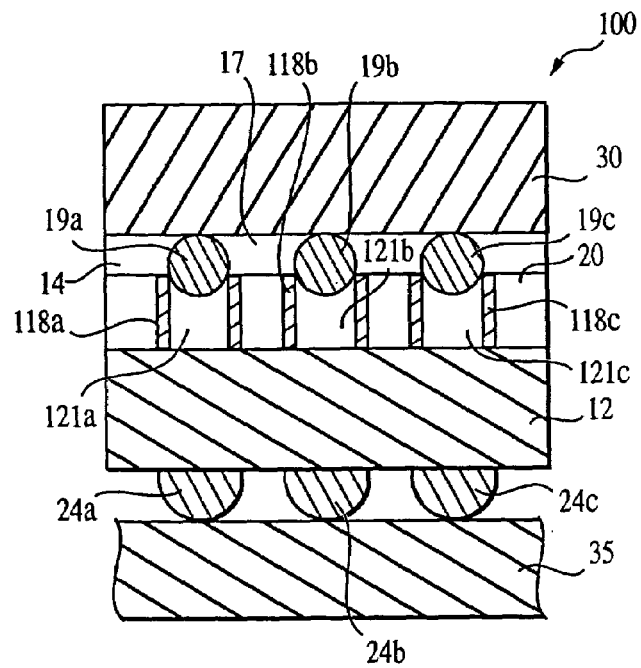
FIG. 5 is a cross-sectional view taken along line V—V of the semiconductor device of FIG. 4.
Figure 6:
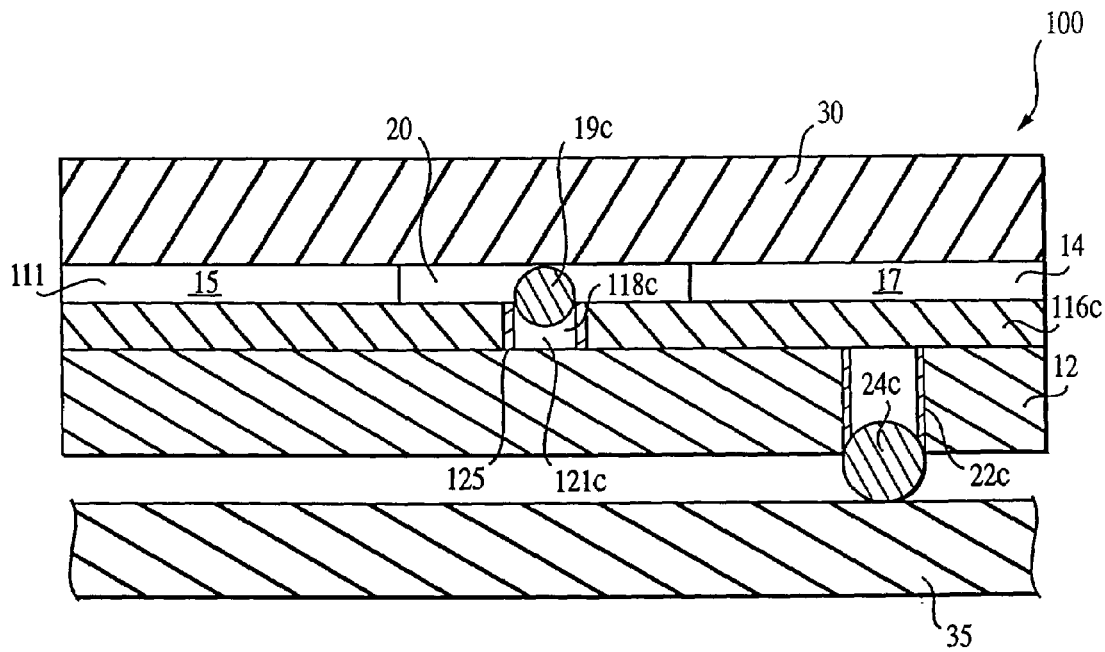
FIG. 6 is a cross-sectional view taken along line VI—VI of the semiconductor device of FIG. 4.

Referring to FIGS. 4–6, where like numerals designate like elements, there is shown a semiconductor device 100, which includes the die 30 and a carrier 111 having the flexible substrate 12 and the elastomeric material 14 with the first and second portions 15, 17. The die 30 is not shown in FIG. 4 for clarity of illustration.

Figure 1:
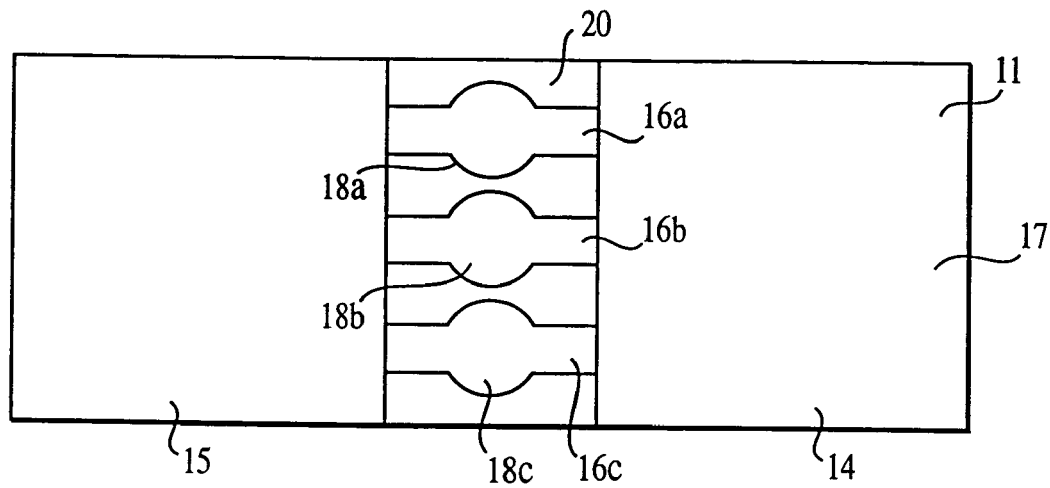
FIG. 1 is a top view of a conventional center bond flip chip carrier.
Figure 2:
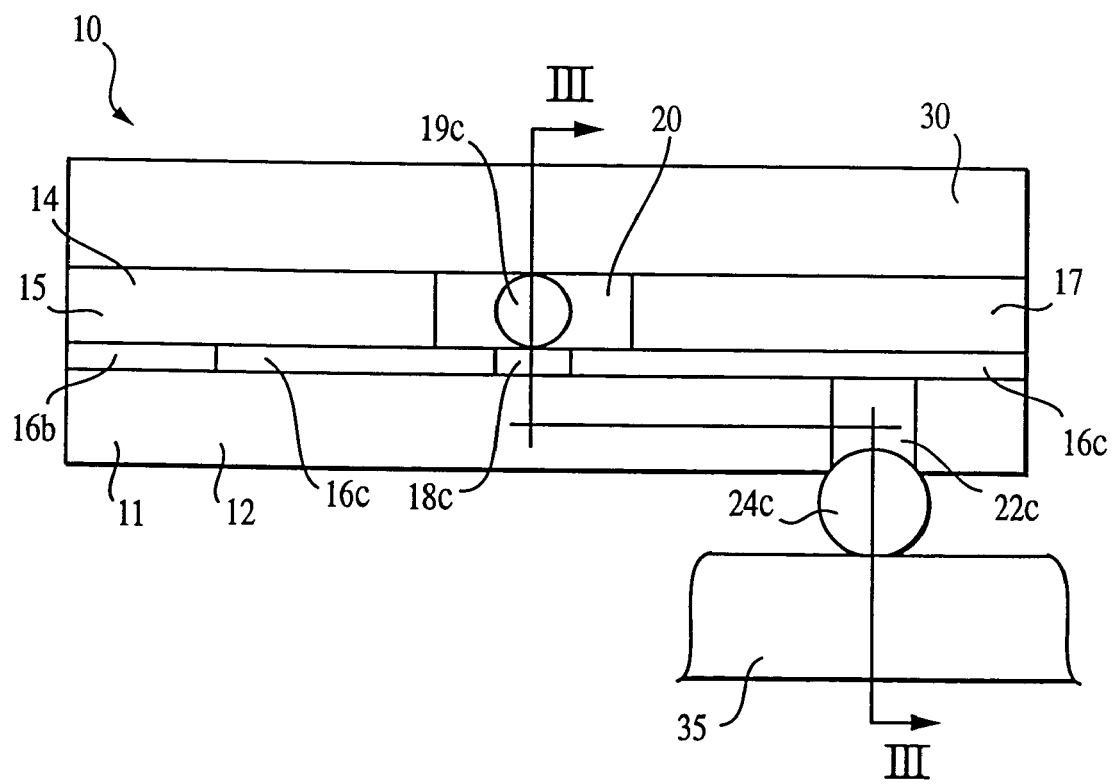
FIG. 2 is a side view of a conventional center bond flip chip semiconductor device incorporating the carrier of FIG. 1.
Figure 3:
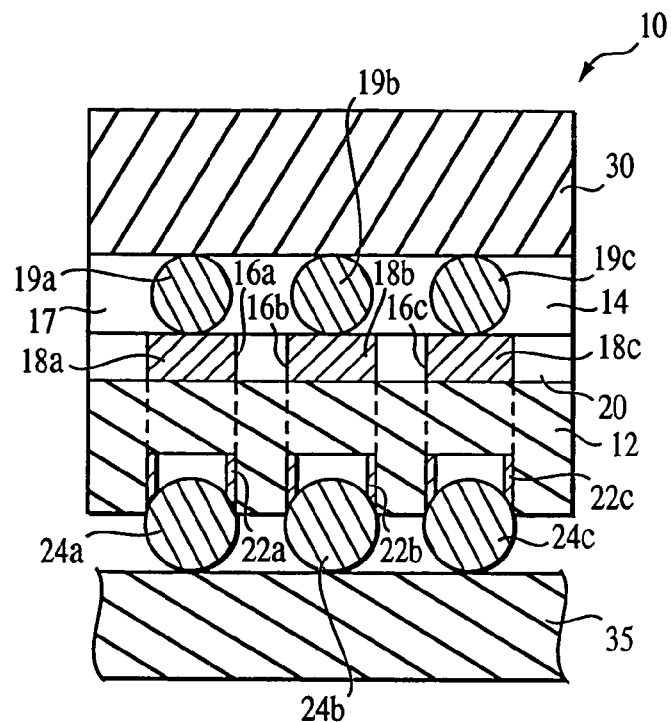
FIG. 3 is a cross-sectional view taken along line III—III of FIG. 2.

As with the device 10 in FIGS. 1–3, a gap 20 is provided in the device 100 between the two portions 15, 17 of the elastomeric material 14. Further, electrically conductive traces $116_a$, $116_b$, $116_c$ are provided on the flexible substrate 12 below the elastomeric material 14. The conductive traces $116_a$, $116_b$, $116_c$ may be included with the flexible substrate 12, or they may be provided subsequently on the substrate 12. Seats $118_a$, $118_b$, $118_c$ are provided, respectively, on conductive traces $116_a$, $116_b$, $116_c$ at a position within the gap 20. The pitch (the distance between each trace $116_a$, $116_b$, $116_c$) is in the range of about 25 to about 500 microns. Preferably, the pitch is about 150 microns. Each of the seats $118_a$, $118_b$, $118_c$ includes, respectively, a recessed seat formed as a cut out portion $121_a$, $121_b$, $121_c$. The cut out portions $121_a$, $121_b$, $121_c$ may be mechanically drilled or coined (compressed), or laser drilled or ablated, or etched.

Further, while the dimension of the cut out portions $121_a$, $121_b$, $121_c$ are dependent upon the size of the inner lead balls $19_a$, $19_b$, $19_c$, they will generally range between 0.005 mm$^2$ and 1.0 mm$^2$. The inner lead balls $19_a$, $19_b$, $19_c$ are preferably about three to four mils in diameter.

Each of these cut out portions $121_a$, $121_b$, $121_c$ provides a recessed seat for the inner lead balls $19_a$, $19_b$, $19_c$. Further, each of the cut out portions $121_a$, $121_b$, $121_c$ serves as a stop to inhibit movement of the inner lead balls $19_a$, $19_b$, $19_c$ either along or transverse to a longitudinal axis of the traces $116_a$, $116_b$, $116_c$. In this way, the inner lead balls $19_a$, $19_b$, $19_c$ are inhibited from moving transversely from the conductive traces $116_a$, $116_b$, $116_c$, thereby lessening the likelihood that a die connected to the carrier 111 will be shorted out by contact of adjacent inner lead balls $19_a$, $19_b$, $19_c$. In addition, the cut out portions $121_a$, $121_b$, $121_c$ help to prevent the wicking of the inner lead balls $19_a$, $19_b$, $19_c$ longitudinally along a respective conductive trace $116_a$, $116_b$, $116_c$.

The ends of the conductive traces $116_a$, $116_b$, $116_c$ may not contact the seats $118_a$, $118_b$, $118_c$. Thus, it may be necessary to coin, or compress, the seats $118_a$, $118_b$, $118_c$ to expand their outer dimensions to the extent that they touch the conductive traces $116_a$, $116_b$, $116_c$. Instead, a surface of the seats $118_a$, $118_b$, $118_c$ may be electroplated with one or more metal layers 125. The metal layers 125 may be formed of a material to enhance solder wetting. Preferably, the surface of the seats $118_a$, $118_b$, $118_c$ are electroplated with nickel and gold to further ensure good electrical contact between the inner lead balls $19_a$, $19_b$, $19_c$ and the respective conductive traces $116_a$, $116_b$, $116_c$. Alternatively, if it is desired to electroplate with a material which restricts solder wetting, the metal layers 125 may be formed of tin, lead, and/or palladium.

Figure 7:
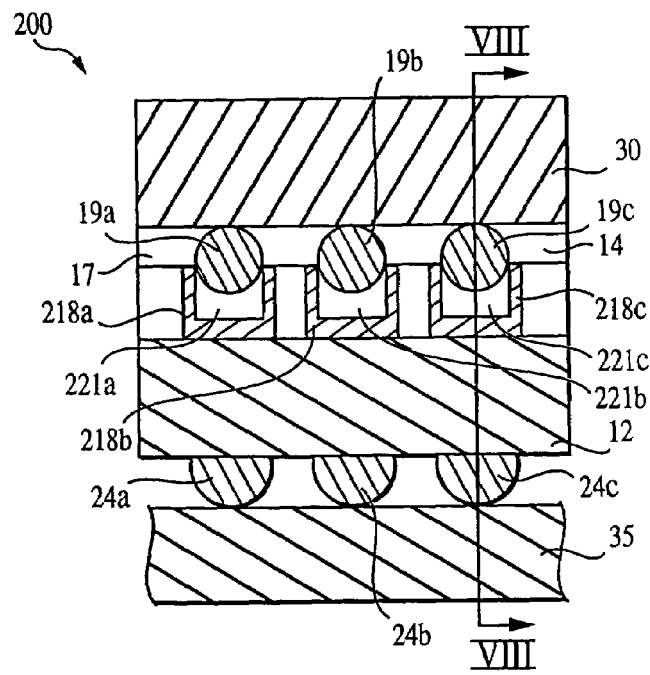
FIG. 7 is a cross-sectional view of another carrier for a center bond flip chip semiconductor device constructed in accordance with another embodiment of the invention.
Figure 8:
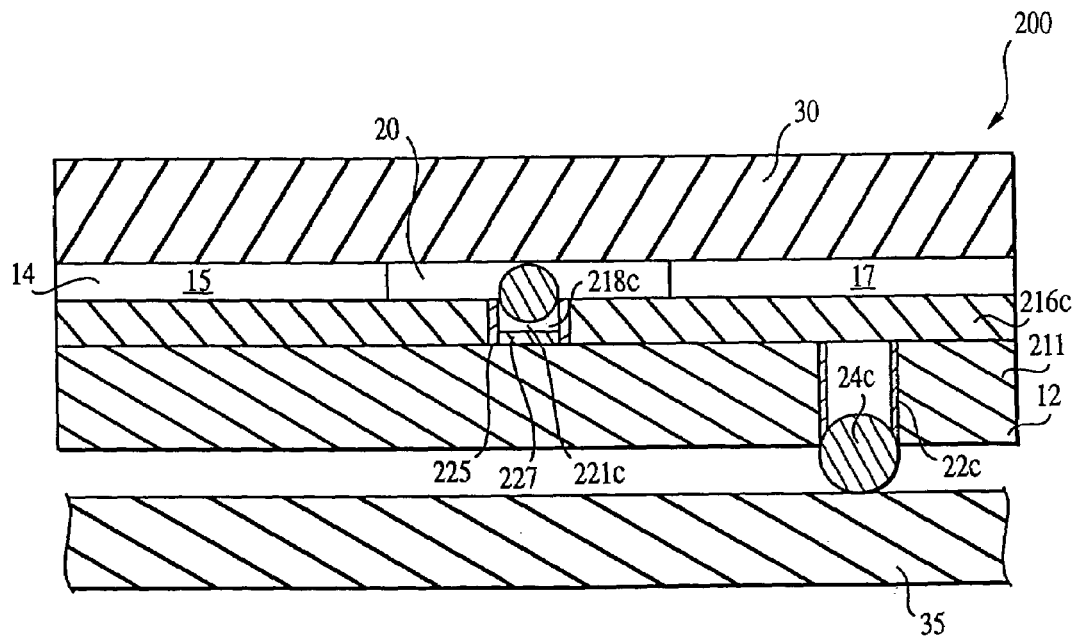
FIG. 8 is a cross-sectional view taken along line VIII—VIII of the semiconductor device of FIG. 7.

FIGS. 7–8 show a center bond flip chip semiconductor device 200 which includes the die 30 and a carrier 211 with the elastomeric material 14 and the flexible substrate 12. A plurality of recessed seats $218_a$, $218_b$, $218_c$ are provided in conductive traces $216_a$, $216_b$, $216_c$, which are provided on the substrate 12. Each of the recessed seats $218_a$, $218_b$, $218_c$ is provided in the gap 20 formed between the portion 15, 17 of the elastomeric material 14. The recessed seats $218_a$, $218_b$, $218_c$ are formed by respective a cut out portions $221_a$, $221_b$, $221_c$ in which respective inner lead balls $19_a$, $19_b$, $19_c$ rest. The semiconductor device 200 of FIGS. 7–8 is different from semiconductor device 100 in FIGS. 4–6 in that the cut out portions $221_a$, $221_b$, $221_c$ do not extend through the entire depth of the conductive traces $216_a$, $216_b$, $216_c$ Instead, a portion of each conductive trace $216_a$, $216_b$, $216_c$ remains below the cut out portions $221_a$, $221_b$, $221_c$, so there is electrical continuity along each of the traces $216_a$, $216_b$, $216_c$.

Figure 9:
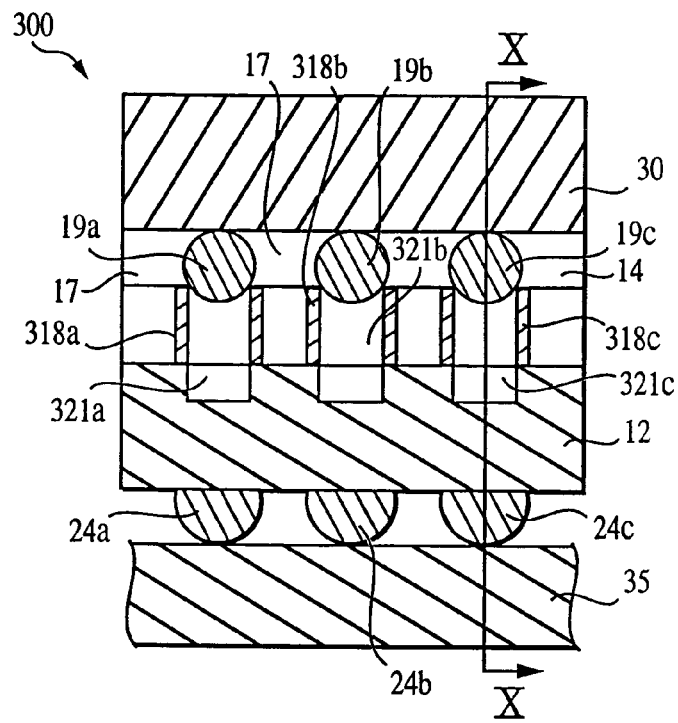
FIG. 9 is a cross-sectional view of a carrier for a center bond flip chip semiconductor device constructed in accordance with another embodiment of the invention.
Figure 10:
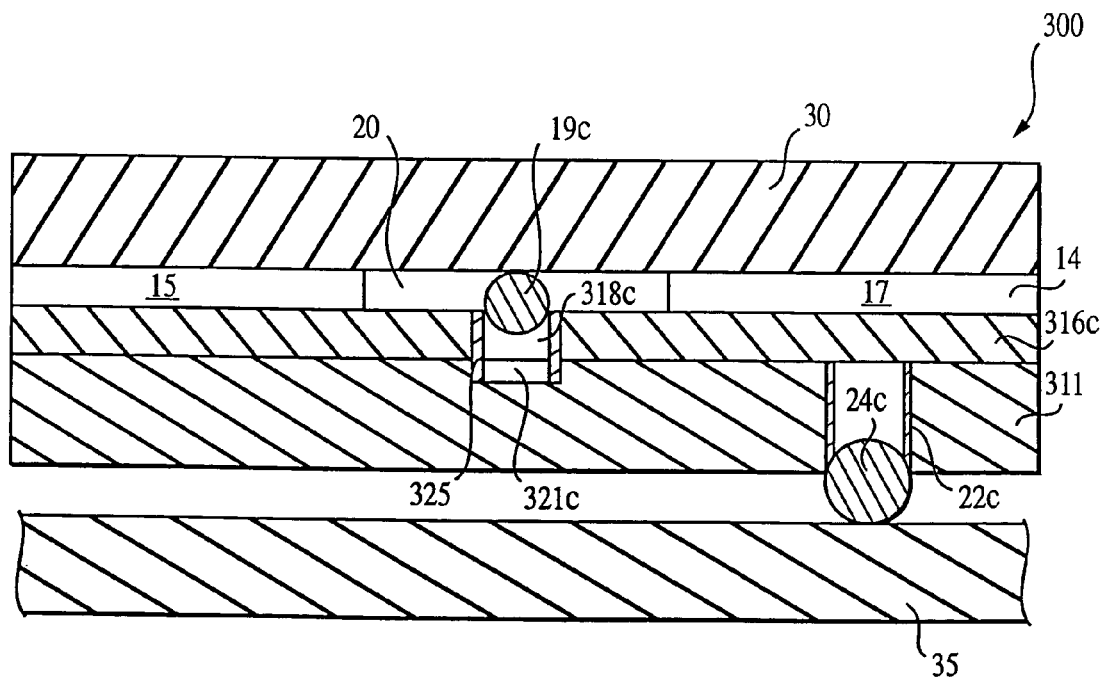
FIG. 10 is a cross-sectional view taken along line X—X of the semiconductor device of FIG. 9.

FIGS. 9–10 show another flip chip semiconductor device 300 which includes the die 30 and a carrier 311 having the elastomeric material 14 and the flexible substrate 12. Seats $318_a$, $318_b$, $318_c$ are positioned along the conductive traces as described above with reference to FIGS. 4–8, and include cut out portions $321_a$, $321_b$, $321_c$. Inner lead balls $19_a$, $19_b$, $19_c$ rest within the seats $318_a$, $318_b$, $318_c$ which are positioned between the elastomeric material 14 and the flexible substrate 12. The semiconductor device 300 differs from the devices 100 (FIGS. 4–6) and 200 (FIGS. 7–8) in that the cut out portions $321_a$, $321_b$, $321_c$ extend into the flexible substrate 12.

Figure 13:
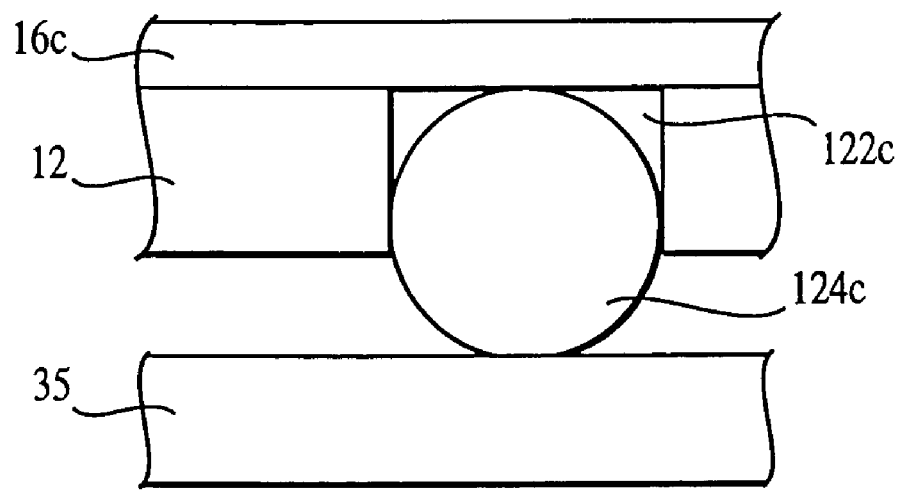
FIG. 13 is a side view of a portion of a flip chip carrier constructed in accordance with another embodiment of the present invention.

FIG. 13 shows a portion of a flip chip semiconductor device. Specifically, an outer lead ball $124_c$ is shown in a via $122_c$. In this embodiment, the outer lead ball $124_c$ is sufficiently large to contact the conductive trace $16_c$ as well as the printed circuit board 35. Thus, electroplating of the sides of the via $122_c$ are not necessary, as the outer lead ball $124_c$ alone electrically connects the conductive trace $16_c$ with the printed circuit board 35 itself. The via $122_c$ is dimensioned to receive the outer lead ball $124_c$.

Figure 14:
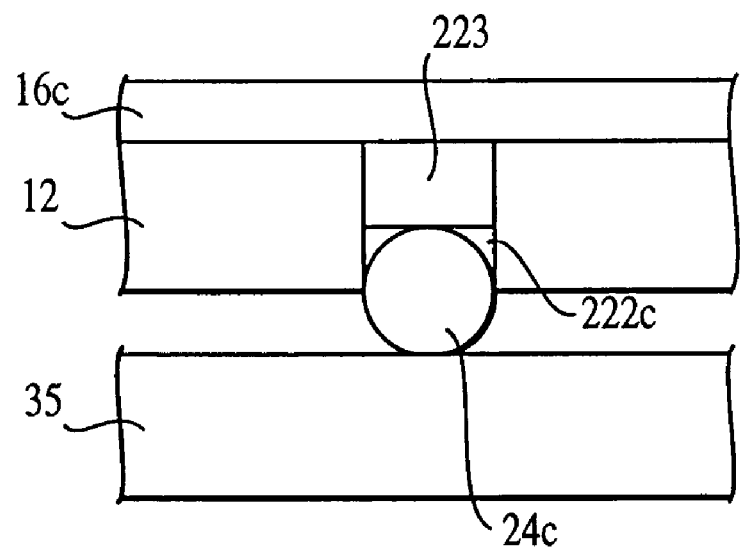
FIG. 14 is a side view of a portion of a flip chip carrier constructed in accordance with another embodiment of the present invention.

Alternatively, as shown in FIG. 14, the outer lead ball $24_c$ is positioned within a via $222_c$. The via $222_c$ differs from the via $22_c$ in that the via $222_c$ lacks electroplating of its sides. Instead, a conductive material 223 is positioned in the via $222_c$ to provide electrical contact between the outer lead ball $24_c$ and the conductive trace $16_c$. The conductive material 223 may be formed of a conductive paste or epoxy, or instead a conductive metal such as copper.

Figure 11:
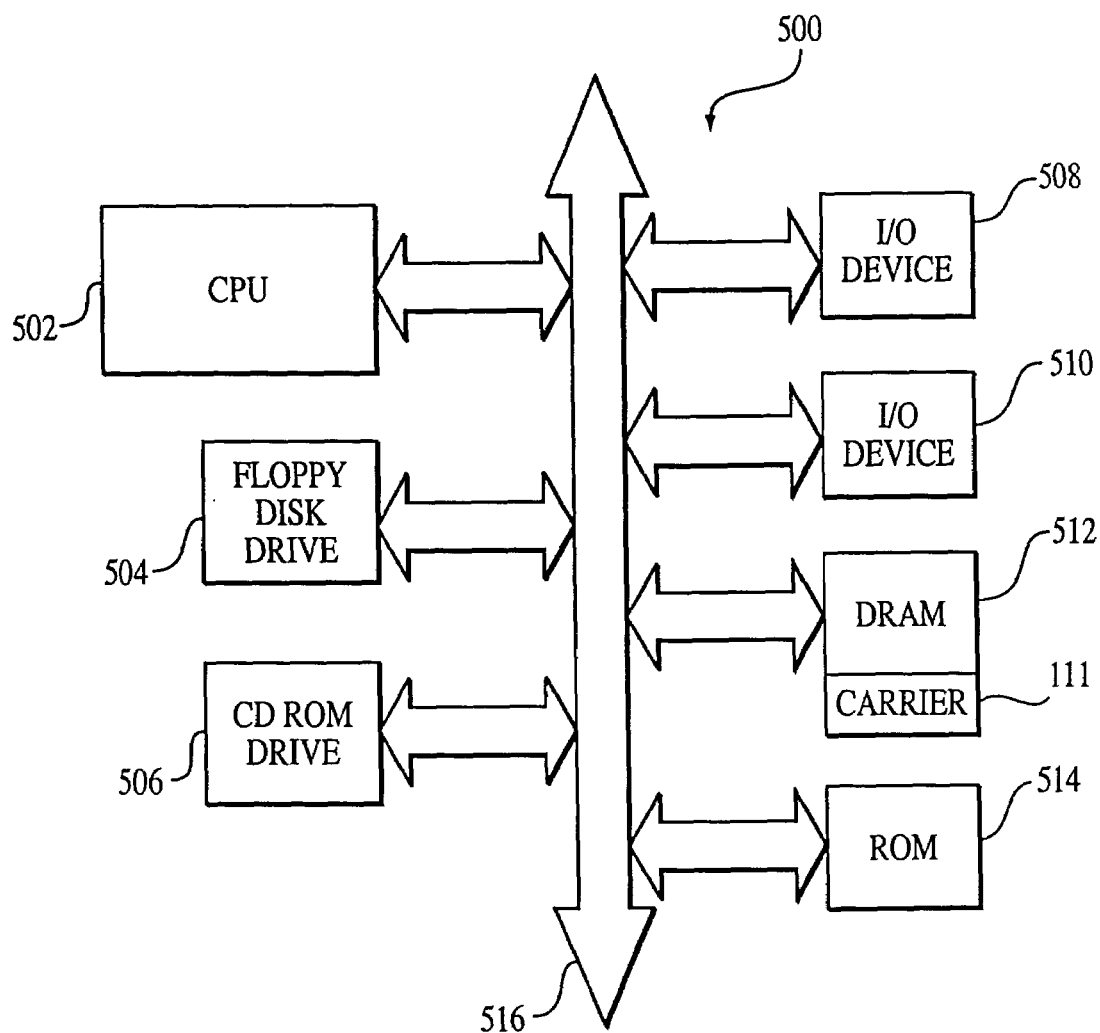
FIG. 11 illustrates a processor-based system utilizing a carrier constructed in accordance with an embodiment of the present invention.

Referring now to FIG. 11, next will be described the use of the carrier 111, 211, 311, carrying a die 30 which contains a memory circuit such as a DRAM, within a processor-based system 500. The processor-based system 500 may be a computer system, a process control system or any other system employing a processor and associated memory. The system 500 includes a central processing unit (CPU) 502, which may be a microprocessor. The CPU 502 communicates with the DRAM 512, which includes the carrier 111 (or the carrier 211 or 311) over a bus 516. The CPU 502 further communicates with one or more I/O devices 508, 510 over the bus 516. Although illustrated as a single bus, the bus 516 may be a series of buses and bridges commonly used in a processor-based system. Further components of the system 500 include a read only memory (ROM) 514 and peripheral devices such as a floppy disk drive 504, and CD ROM drive 506. The floppy disk drive 504 and CD ROM drive 506 communicate with the CPU 502 over the bus 516.

Figure 12:
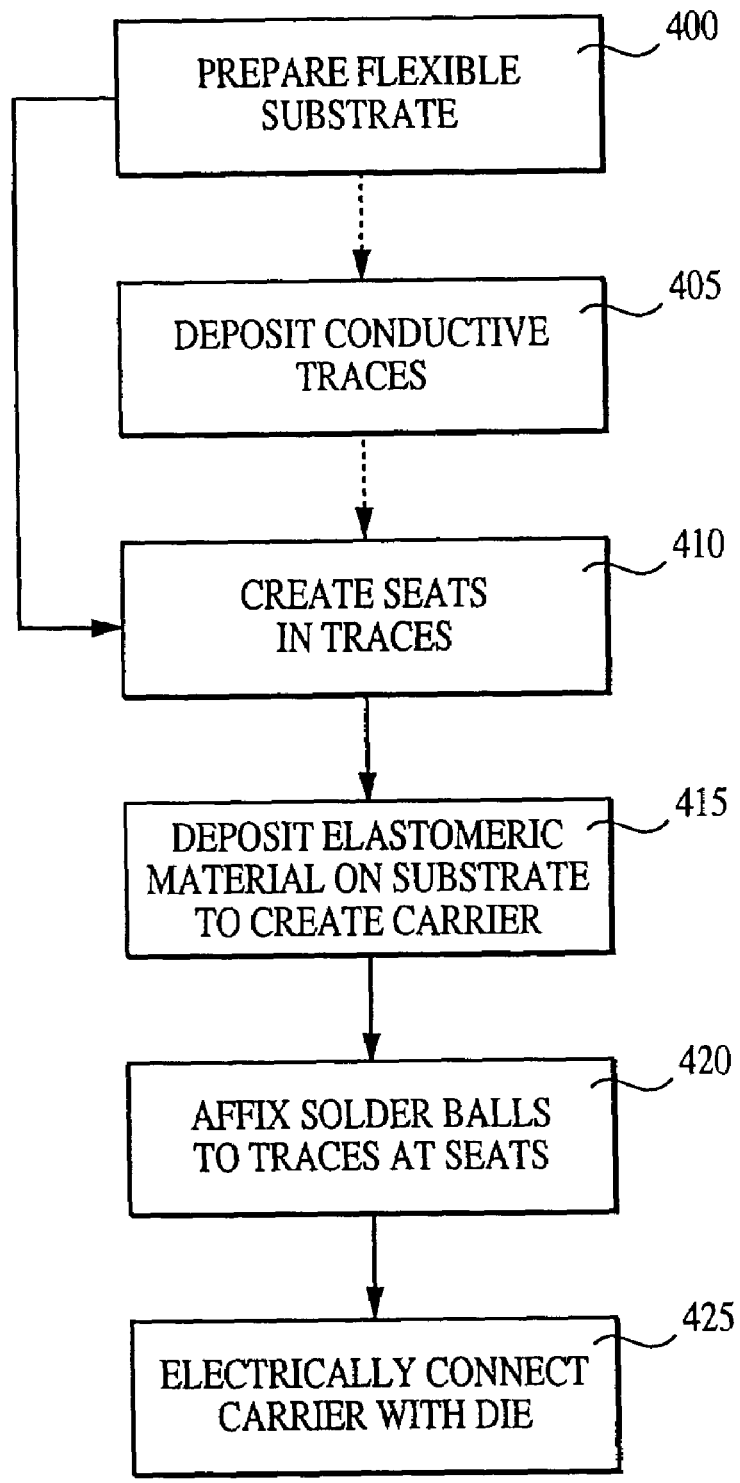
FIG. 12 is a flow diagram of the steps in making the flip chip carrier of FIGS. 4–10 and a semiconductor device using the carrier.

With reference to FIG. 12, next will be described a method for making the flip chip carriers 111, 211, 311 as well as a semiconductor device in which the carriers are used to mount and support a semiconductor die. Manufacture of the carriers 111, 211, 311 begins with preparation of the flexible substrate 12 at step 400. The conductive traces $116_a$, $116_b$, $116_c$ (or $216_a$, $216_b$, $216_c$ or $316_a$, $316_b$, $316_c$) may be included with the substrate 12, or optionally, they are deposited on the substrate 12 at step 405 by way of electrolytic deposition, sputter coating, laminating a conductive material to the substrate 12 and etching away the excess, or other suitable deposition method. The cut out portions $121_a$, $121_b$, $121_c$ (or $221_a$, $221_b$, $221_c$ or $321_a$, $321_b$, $321_c$) are created within the traces at step 410 by laser or mechanical drilling or by etching. At step 415, the elastomeric material 14 is deposited over the substrate 12 and the traces to form the carriers 111, 211, 311.

Inner lead balls $19_a$, $19_b$, $19_c$ are affixed to the traces $116_a$, $116_b$, $116_c$ (or $216_a$, $216_b$, $216_c$ or $316_a$, $316_b$, $316_c$) at the seats $118_a$, $118_b$, $118_c$ (or $218_a$, $218_b$, $218_c$ or $318_a$, $318_b$, $318_c$) at step 420. Alternatively, the inner lead balls $19_a$, $19_b$, $19_c$ may be affixed to the die 30. The thus formed carrier 111, 211, 311 is then electrically connected with the die 30 bond pads at step 425 by bringing the two into contact and melting the solder balls to provide a solid mechanical and electrical contact of the die to the carrier.

Users of the thus manufactured semiconductor devices 100, 200, 300 may attach and electrically connect the devices with the printed circuit board 35 or other common base for mounting of components to form an electronic system.

The present invention provides a flip chip carrier and a semiconductor device employing it which is inhibited from being shorted out by closely spaced interconnected conductors, e.g., solder balls, and which reduces the chance of solder wicking along the electrical traces.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the description and illustrations depict a center bond flip chip semiconductor device, it is to be understood that the invention is not so limited. Further, while three traces have been shown and described for the carriers 111, 211, 311, in order to illustrate the invention it should be apparent that many more traces will be used in practice. Indeed, any number of traces may be included. In addition, although inner lead balls $19_a$, $19_b$, $19_c$ have been described and illustrated, other suitable types of conductive connecting structures may be employed. Accordingly, the invention is not to be seen as limited by the foregoing description, but is only limited by the scope of the appended claims.

What is claimed as new and desired to be protected by Letters Patent of the United States is:

1. A method for making a carrier for a semiconductor device, said method comprising:
   forming a seat with a cut out portion in at least one trace located on a substrate, said seat being sized and configured to receive a conductive connecting structure; and
   providing an elastomeric material over said substrate and said at least one trace with a gap at said seat to allow electrical connection of the conductive connecting structure with a semiconductor die,
   wherein said forming a seat with a cut out portion comprises extending the cut out portion to the at least one trace located on the substrate.

2. The method of claim 1, further comprising the act of affixing the conductive connecting structure to said cut out portion.

3. The method of claim 2, wherein said affixing comprises affixing a solder ball to said seat.

4. The method of claim 3, further comprising electroplating said seat with one or more metals.

5. The method of claim 1, further comprising affixing the conductive connecting structure to said semiconductor die.

6. The method of claim 1, wherein forming comprises forming a seat with a cut out portion for each trace.

7. The method of claim 1, wherein said forming comprises laser drilling.

8. The method of claim 1, wherein said forming comprises mechanical drilling.

9. The method of claim 1, wherein said forming comprises etching.

10. The method of claim 1, wherein said forming comprises mechanical coining.

11. The method of claim 1, wherein said forming comprises laser ablating.

12. A method for making a carrier for a semiconductor device, said method comprising:
   forming a seat with a cut out portion in at least one trace located on a substrate, said seat being sized and configured to receive a conductive connecting structure; and
   providing an elastomeric material over said substrate and said at least one trace with a gap at said seat to allow electrical connection of the conductive connecting structure with a semiconductor die,
wherein said forming a seat with a cut out portion comprises extending the cut out portion into the substrate.

13. A method of making a semiconductor device comprising:
assembling a carrier, said assembling comprising:
forming a seat with a cut out portion in at least one trace located on a substrate, said seat being sized and configured to receive a conductive connecting structure, and
positioning an elastomeric material over said substrate and said at least one trace with a gap at said seat to allow electrical connection of the conductive connecting structure with a semiconductor die; and
electrically connecting said carrier with the semiconductor die,
wherein said forming a seat with a cut out portion comprises extending the cut out portion into the substrate.

14. The method of claim 13, further comprising affixing the conductive connecting structure to said cut out portion.

15. The method of claim 14, wherein said affixing comprises affixing a solder ball to said seat.

16. The method of claim 15, further comprising electroplating said seat with one or more metals.

17. The method of claim 13, further comprising affixing the conductive connecting structure to said semiconductor die.

18. The method of claim 13, wherein forming comprises forming a seat with a cut out portion for each trace.

19. The method of claim 13, wherein said forming comprises laser drilling.

20. The method of claim 13, wherein said forming comprises mechanical drilling.

21. The method of claim 13, wherein said forming comprises etching.

22. The method of claim 13, wherein said forming comprises mechanical coining.

23. The method of claim 13, wherein said forming comprises laser ablating.

24. A method of making a semiconductor device comprising:
assembling a carrier, said assembling comprising:
forming a seat with a cut out portion in at least one trace located on a substrate, said seat being sized and configured to receive a conductive connecting structure, and
positioning an elastomeric material over said substrate and said at least one trace with a gap at said seat to allow electrical connection of the conductive connecting structure with a semiconductor die; and
electrically connecting said carrier with the semiconductor die,
wherein said forming a seat with a cut out portion comprises extending the cut out portion to the at least one trace located on the substrate.

* * * * *